United States Patent
Sun et al.

(10) Patent No.: US 10,459,568 B2
(45) Date of Patent: Oct. 29, 2019

(54) SHIFT REGISTER, DRIVING METHOD THEREOF, GATE DRIVING CIRCUIT AND DISPLAY APPARATUS

(71) Applicants: BOE TECHNOLOGY GROUP CO., LTD., Beijing (CN); Hefei BOE Optoelectronics Technology Co., Ltd., Hefei, Anhui (CN)

(72) Inventors: Li Sun, Beijing (CN); Jian Tao, Beijing (CN); Hongmin Li, Beijing (CN); Fengjing Tang, Beijing (CN)

(73) Assignees: BOE TECHNOLOGY GROUP CO., LTD., Beijing (CN); HEFEI BOE OPTOELECTRONICS TECHNOLOGY CO., LTD., Hefei, Anhui (CN)

( * ) Notice: Subject to any disclaimer, the term of this patent is extended or adjusted under 35 U.S.C. 154(b) by 29 days.

(21) Appl. No.: 15/939,518

(22) Filed: Mar. 29, 2018

(65) Prior Publication Data

US 2019/0129561 A1    May 2, 2019

(30) Foreign Application Priority Data

Oct. 27, 2017    (CN) .......................... 2017 1 1052289

(51) Int. Cl.
| | | |
|---|---|---|
| G09G 3/3266 | (2016.01) | |
| G06F 3/041 | (2006.01) | |
| G09G 3/20 | (2006.01) | |
| G11C 19/28 | (2006.01) | |

(52) U.S. Cl.
CPC ............. *G06F 3/0416* (2013.01); *G09G 3/20* (2013.01); *G11C 19/28* (2013.01); *G06F 3/0412* (2013.01); *G09G 2310/0286* (2013.01); *G09G 2310/08* (2013.01)

(58) Field of Classification Search
CPC ................. G09G 2310/0262–2310/067; G09G 2310/02–2310/0216; G09G 3/3674–3/3681; G09G 2310/062; G09G 2310/0278–2310/0289
See application file for complete search history.

(56) References Cited

U.S. PATENT DOCUMENTS

| | | | | |
|---|---|---|---|---|
| 2016/0224175 | A1* | 8/2016 | Moon | G06F 3/0412 |
| 2016/0328045 | A1* | 11/2016 | Wang | G06F 3/016 |
| 2017/0123539 | A1* | 5/2017 | Wang | G06F 3/044 |
| 2017/0123556 | A1* | 5/2017 | Lin | G06F 3/0412 |

* cited by examiner

*Primary Examiner* — Sanghyuk Park
(74) *Attorney, Agent, or Firm* — Kinney & Lange, P.A.

(57) ABSTRACT

The embodiments of the present disclosure disclose a shift register, a driving method thereof, a gate driving circuit and a display apparatus. The shift register includes a pull-up sub-circuit, an output sub-circuit and a touch and hold sub-circuit, wherein the touch and hold sub-circuit is electrically connected to a first touch signal terminal, a second touch signal terminal, a second node, a second power supply terminal, and a second output terminal, and is configured to store a potential at the second node and output the potential at the second node to the second output terminal under control of signals from the first touch signal terminal and the second touch signal terminal.

20 Claims, 5 Drawing Sheets

SHIFT REGISTER, DRIVING METHOD THEREOF, GATE DRIVING CIRCUIT AND DISPLAY APPARATUS

CROSS-REFERENCE TO RELATED APPLICATION(S)

This application claims priority to the Chinese Patent Application No. 201711052289.1, filed on Oct. 27, 2017, which is incorporated herein by reference in its entirety.

TECHNICAL FIELD

The embodiments of the present disclosure relate to the field of display technology, and more particularly, to a shift register, a driving method thereof, a gate driving circuit and a display apparatus.

BACKGROUND

Touch screens can realize a display function and a touch function. In general, the touch function can only be implemented between two frames of display, which results in poor touch performance of the touch screen.

SUMMARY

According to an aspect of the present disclosure, there is provided a shift register. The shift register includes a pull-up sub-circuit, an output sub-circuit and a touch and hold sub-circuit. The pull-up sub-circuit is electrically connected to a first power supply terminal, a signal input terminal and a first node, and is configured to provide a signal from the first power supply terminal to the first node under control of a signal from the signal input terminal; the output sub-circuit is electrically connected to a clock signal terminal, the first node, a second node and a first output terminal, and is configured to provide a clock signal from the clock signal terminal to the second node and the first output terminal under control of a potential at the first node; and the touch and hold sub-circuit is electrically connected to a first touch signal terminal, a second touch signal terminal, the second node, a second power supply terminal, and a second output terminal, and is configured to store a potential at the second node and output the potential at the second node to the second output terminal under control of signals from the first touch signal terminal and the second touch signal terminal.

In an embodiment, the shift register further includes: a de-noising sub-circuit and a reset sub-circuit. The de-noising sub-circuit is electrically connected to the first node, the second node, the second power supply terminal, and a touch control signal terminal, and is configured to provide a signal from the second power supply terminal to the second node under control of a signal from the touch control signal terminal and the potential at the first node; and the reset sub-circuit is electrically connected to a reset signal terminal, the second power supply terminal, a third power supply terminal, the first node, the second node, and the first output terminal, and is configured to provide a signal from the third power supply terminal to the first node and provide the signal from the second power supply terminal to the second node and the first output terminal under control of a signal from the reset signal terminal.

In an embodiment, the pull-up sub-circuit includes a first transistor. The first transistor has a gate electrically connected to the signal input terminal, a first electrode electrically connected to the first power supply terminal, and a second electrode electrically connected to the first node.

In an embodiment, the output sub-circuit includes a first capacitor, a third transistor and a fifth transistor. The first capacitor has one terminal electrically connected to the first node, and the other terminal electrically connected to the second node; the third transistor has a gate electrically connected to the first node, a first electrode electrically connected to the clock signal terminal, and a second electrode electrically connected to the second node; and the fifth transistor has a gate electrically connected to the first node, a first electrode electrically connected to the clock signal terminal, and a second electrode electrically connected to the first output terminal.

In an embodiment, the touch and hold sub-circuit includes a seventh transistor, an eighth transistor and a second capacitor. The seventh transistor has a gate electrically connected to the first touch signal terminal, a first electrode electrically connected to the second node, and a second electrode electrically connected to a first electrode of the eighth transistor; the eighth transistor has a gate electrically connected to the second touch signal terminal, the first electrode electrically connected to one terminal of the second capacitor, and a second electrode electrically connected to the second output terminal; and the second capacitor has the other terminal electrically connected to the second power supply terminal.

In an embodiment, the reset sub-circuit includes a second transistor, a fourth transistor and a sixth transistor. The second transistor has a gate electrically connected to the reset signal terminal, a first electrode electrically connected to the first node, and a second electrode electrically connected to the third power supply terminal; the fourth transistor has a gate electrically connected to the reset signal terminal, a first electrode electrically connected to the second node, and a second electrode electrically connected to the second power supply terminal; and the sixth transistor has a gate electrically connected to the reset signal terminal, a first electrode electrically connected to the first output terminal, and a second electrode electrically connected to the second power supply terminal.

In an embodiment, the de-noising sub-circuit includes a ninth transistor, a tenth transistor, and an eleventh transistor. The ninth transistor has a gate and a first electrode electrically connected to the touch control signal terminal, and a second electrode electrically connected to a gate of the eleventh transistor; the tenth transistor has a gate electrically connected to the first node, a first electrode electrically connected to the gate of the eleventh transistor, and a second electrode electrically connected to the second power supply terminal; and the eleventh transistor has a first electrode electrically connected to the second node, and a second electrode electrically connected to the second power supply terminal.

According to another aspect of the present disclosure, there is provided a gate driving circuit. The gate driving circuit includes a plurality of cascaded shift registers according to the embodiments described above. For each stage of shift register except for a last stage of shift register, a second output terminal of a current stage of shift register is electrically connected to a signal input terminal of a next stage of shift register, and a reset signal terminal of the current stage of shift register is electrically connected to a second output terminal of the next stage of shift register.

According to another aspect of the present disclosure, there is provided a display apparatus. The display apparatus includes the gate driving circuit according to the embodiments described above.

According to another aspect of the present disclosure, there is provided a driving method of the shift register according to the embodiments described above. The driving method includes: in an input phase, providing, by the pull-up sub-circuit, a signal from the first power supply terminal to the first node under control of a signal from the signal input terminal; in an output phase, providing, by the output sub-circuit, a clock signal from the clock signal terminal to the second node and the first output terminal under control of a potential at the first node, and storing, by the touch and hold sub-circuit, a potential at the second node; in a touch phase, holding, by the touch and hold sub-circuit, the potential at the second node; and in a transition phase, outputting, by the touch and hold sub-circuit, the potential at the second node to the second output terminal.

In an embodiment, the method further includes: in a reset phase, providing, by the reset sub-circuit, a signal from the third power supply terminal to the first node and providing a signal from the second power supply terminal to the second node and the first output terminal under control of a signal from the reset signal terminal, and providing, by the de-noising sub-circuit, the signal from the second power supply terminal to the second node under control of a signal from the touch control signal terminal and the potential at the first node.

In an embodiment, storing, by the touch and hold sub-circuit, the potential at the second node includes: storing, by the touch and hold sub-circuit, the potential at the second node under control of a signal from the first touch signal terminal.

In an embodiment, outputting, by the touch and hold sub-circuit, the potential at the second node to the second output terminal includes: outputting, by the touch and hold sub-circuit, the potential at the second node to the second output terminal under control of a signal from the second touch signal terminal.

BRIEF DESCRIPTION OF THE DRAWINGS

The accompanying drawings are used to provide a further understanding of the technical solutions of the present disclosure and constitute a part of the specification. The accompanying drawings are used together with the embodiments of the present application to explain the technical solutions of the present disclosure and do not constitute limitations on the technical solutions of the present disclosure.

DETAILED DESCRIPTION

In order to make the purposes, technical solutions, and advantages of the present disclosure more clear, the embodiments of the present disclosure will be described in detail below with reference to the accompanying drawings. It should be illustrated that the embodiments in the present application and the features in the embodiments can be combined with each other randomly without a conflict.

Unless otherwise defined, technical terms or scientific terms used in the embodiments of the present disclosure should be interpreted in an ordinary sense for those of ordinary skill in the art to which the present disclosure belongs. The words such as "first," "second," etc. used in the embodiments of the present disclosure do not imply any order, quantity or importance, but merely serve to distinguish different constituent parts. The word such as "comprising" or "including" etc. means that an element or item preceding the word covers elements or items which appear after the word and their equivalents, but does not exclude other elements or items.

Figure 1:
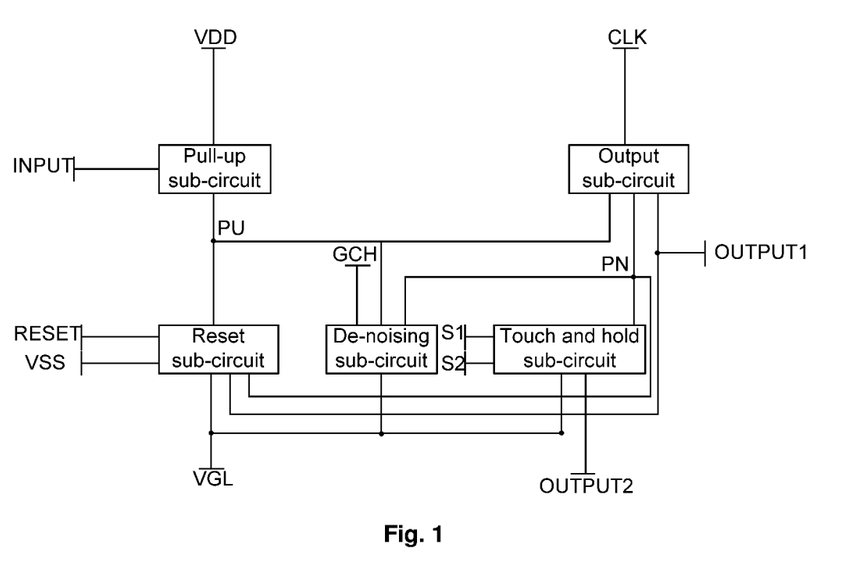
FIG. 1 is a structural diagram of a shift register according to an embodiment of the present disclosure.

FIG. 1 is a structural diagram of a shift register according to an embodiment of the present disclosure. As shown in FIG. 1, the shift register according to the embodiment of the present disclosure includes a pull-up sub-circuit, an output sub-circuit, and a touch and hold sub-circuit.

In the present embodiment, the pull-up sub-circuit is electrically connected to a first power supply terminal VDD, a signal input terminal INPUT, and a first node PU, and is configured to provide a signal from the first power supply terminal VDD to the first node PU under control of the signal input terminal INPUT.

The output sub-circuit is electrically connected to a clock signal terminal CLK, the first node PU, a second node PN, and a first output terminal OUTPUT1, and is configured to provide a clock signal from the clock signal terminal CLK to the second node PN and the first output terminal OUTPUT1 under control of the first node PU.

The touch and hold sub-circuit is electrically connected to a first touch signal terminal S1, a second touch signal terminal S2, the second node PN, a second power supply terminal VGL, and a second output terminal OUTPUT2, and is configured to store a potential at the second node PN and output the potential at the second node PN to the second output terminal OUTPUT2 under control of the first touch signal terminal S1 and the second touch signal terminal S2.

Specifically, the first output terminal OUTPUT1 provides a gate driving signal to a current stage of shift register, and the second output terminal OUTPUT2 is electrically connected to a signal input terminal of a next stage of shift register. In the embodiment of the present disclosure, after the touch is completed, the potential stored at the second node is output to the second output terminal OUTPUT2, to continue to trigger a next row, so as to complete progressive output of the gate driving signal.

As described above, in the technical solutions according to the present disclosure, the touch and hold sub-circuit is added in the shift register. Therefore, a touch timing can be inserted after a gate output for any row is completed. By storing an output signal of a row for which scanning is interrupted, and the output signal may be output after the touch timing has passed to continue to trigger a next row, so as to complete progressive output of the gate driving signal. In this way, not only intra-frame touch is realized, but also the touch frequency and touch performance can be improved.

In an example, the shift register according to the embodiment of the present disclosure further includes a de-noising sub-circuit and a reset sub-circuit.

The de-noising sub-circuit is electrically connected to the first node PU, the second node PN, the second power supply terminal VGL, and a touch control signal terminal GCH and is configured to provide a signal from the second power supply terminal VGL to the second node PN under control of the touch control signal terminal GCH and the first node PU.

The reset sub-circuit is electrically connected to a reset signal terminal RESET, the second power supply terminal VGL, a third power supply terminal VSS, the first node PU, the second node PN, and the first output terminal OUTPUT1, and is configured to provide a signal from the third power supply terminal VSS to the first node PU, and provide the signal from the second power supply terminal VGL to the second node PN and the first output terminal OUTPUT1 under control of the reset signal terminal RESET.

In the embodiment of the present disclosure, the denoising sub-circuit and the reset sub-circuit are added in the shift register, which can reduce noise in the shift register.

Figure 2:
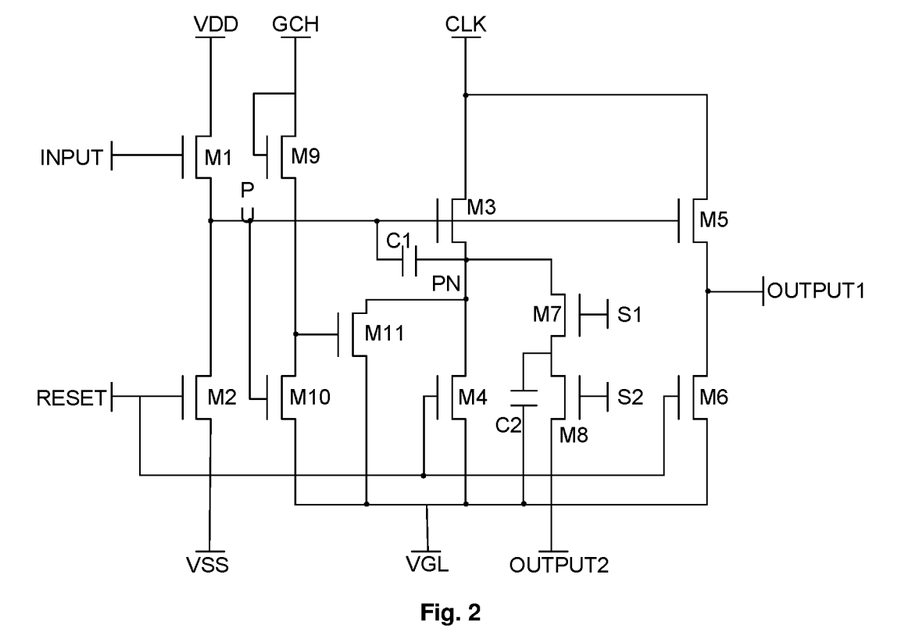
FIG. 2 is an equivalent circuit diagram of a shift register according to an embodiment of the present disclosure.

FIG. 2 is an equivalent circuit diagram of a shift register according to an embodiment of the present disclosure. FIG. 2 specifically illustrates an exemplary structure of a pull-up sub-circuit, a reset sub-circuit, a de-noising sub-circuit, an output sub-circuit, and a touch and hold sub-circuit. It can be easily understood by those skilled in the art that implementations of the above sub-circuits are not limited thereto, as long as respective functions thereof can be achieved In an embodiment, the pull-up sub-circuit includes a first transistor M1, wherein the first transistor M1 has a gate electrically connected to the signal input terminal INPUT, a first electrode electrically connected to the first power supply terminal VDD, and a second electrode electrically connected to the first node PU.

In an embodiment, the output sub-circuit includes a first capacitor C1, a third transistor M3, and a fifth transistor M5. The first capacitor C1 has one terminal electrically connected to the first node PU, and the other terminal electrically connected to the second node PN. The third transistor M3 has a gate electrically connected to the first node PU, a first electrode electrically connected to the clock signal terminal CLK, and a second electrode electrically connected to the second node PN. The fifth transistor M5 has a gate electrically connected to the first node PU, a first electrode electrically connected to the clock signal terminal CLK, and a second electrode electrically connected to the first output terminal OUTPUT1.

In an embodiment, the touch and hold sub-circuit includes a seventh transistor M7, an eighth transistor M8, and a second capacitor C2. The seventh transistor M7 has a gate electrically connected to the first touch signal terminal S1, a first electrode electrically connected to the second node PN, and a second electrode electrically connected to a first electrode of the eighth transistor M8. The eighth transistor M8 has a gate electrically connected to the second touch signal terminal S2, a first electrode electrically connected to one terminal of the second capacitor C2, and a second electrode electrically connected to the second output terminal OUTPUT2. The second capacitor C2 has the other terminal electrically connected to the second power supply terminal VGL.

Specifically, the seventh transistor M7 is configured to be turned on to store the potential at the second node PN in the second capacitor when the signal from the first touch signal terminal S1 is at a high level; and the eighth transistor M8 is configured to be turned on to release the potential at the second node PN to the second output terminal OUTPUT2 when the signal from the second touch signal terminal S2 is at a high level.

In an embodiment, the reset sub-circuit includes a second transistor M2, a fourth transistor M4, and a sixth transistor M6. The second transistor M2 has a gate electrically connected to the reset signal terminal RESET, a first electrode electrically connected to the first node PU, and a second electrode electrically connected to the third power supply terminal VSS. The fourth transistor M4 has a gate electrically connected to the reset signal terminal RESET, a first electrode electrically connected to the second node PN, and a second electrode electrically connected to the second power supply terminal VGL. The sixth transistor M6 has a gate electrically connected to the reset signal terminal RESET, a first electrode electrically connected to the first output terminal OUTPUT1, and a second electrode electrically connected to the second power supply terminal VGL.

Specifically, the second transistor M2 is configured to be turned on to pull down the potential at the first node PU to a low level of the third power supply terminal VSS when the signal from the reset signal terminal RESET is at a high level; the fourth transistor M4 is configured to be turned on to pull down the potential at the second node PN to a low level of the second power supply terminal VGL when the signal from the reset signal terminal RESET is at a high level; and the sixth transistor M6 is configured to be turned on to pull down a potential at the first OUTPUT1 to the low level of the second power supply terminal VGL when the signal from the reset signal terminal RESET is at a high level.

In an embodiment, the de-noising sub-circuit includes a ninth transistor M9, a tenth transistor M10 and an eleventh transistor M11. The ninth transistor M9 has a gate and a first electrode electrically connected to the touch control signal terminal GCH, and a second electrode electrically connected to a gate of the eleventh transistor M11; the tenth transistor M10 has a gate electrically connected to the first node PU, a first electrode electrically connected to the gate of the eleventh transistor M11, and a second electrode electrically connected to the second power supply terminal VGL; and the eleventh transistor M11 has a first electrode electrically connected to the second node PN, and a second electrode electrically connected to the second power supply terminal VGL. Channel width to length ratios of the ninth transistor M9 and the tenth transistor M10 are designed so that the signal from the second power supply terminal VGL is received by the gate of the eleventh transistor M11 when both of the ninth transistor M9 and the tenth transistor M10 are turned on to operate.

In the present embodiment, each of the transistors M1-M11 may be an N-type thin film transistor or a P-type thin film transistor. Process flows may be unified to reduce a number of the process flows, which facilitates improving the yield of the product. In addition, in consideration of small leakage current of low-temperature polysilicon thin film transistors, in an embodiment of in the present disclosure, all the transistors are low-temperature polysilicon thin film transistors, which may specifically be thin film transistors having a bottom gate structure or thin film transistors having a top gate structure, as long as a switching function can be achieved.

It should be illustrated that the first capacitor C1 and the second capacitor C2 may be liquid crystal capacitors formed by pixel electrodes and common electrodes, or may be a liquid crystal capacitor formed by a pixel electrode and a common electrode and an equivalent capacitor formed by a storage capacitor, which is not limited in the present disclosure.

The technical solutions according to the embodiments of the present disclosure will be further described below through an operation process of the shift register.

Figure 3:
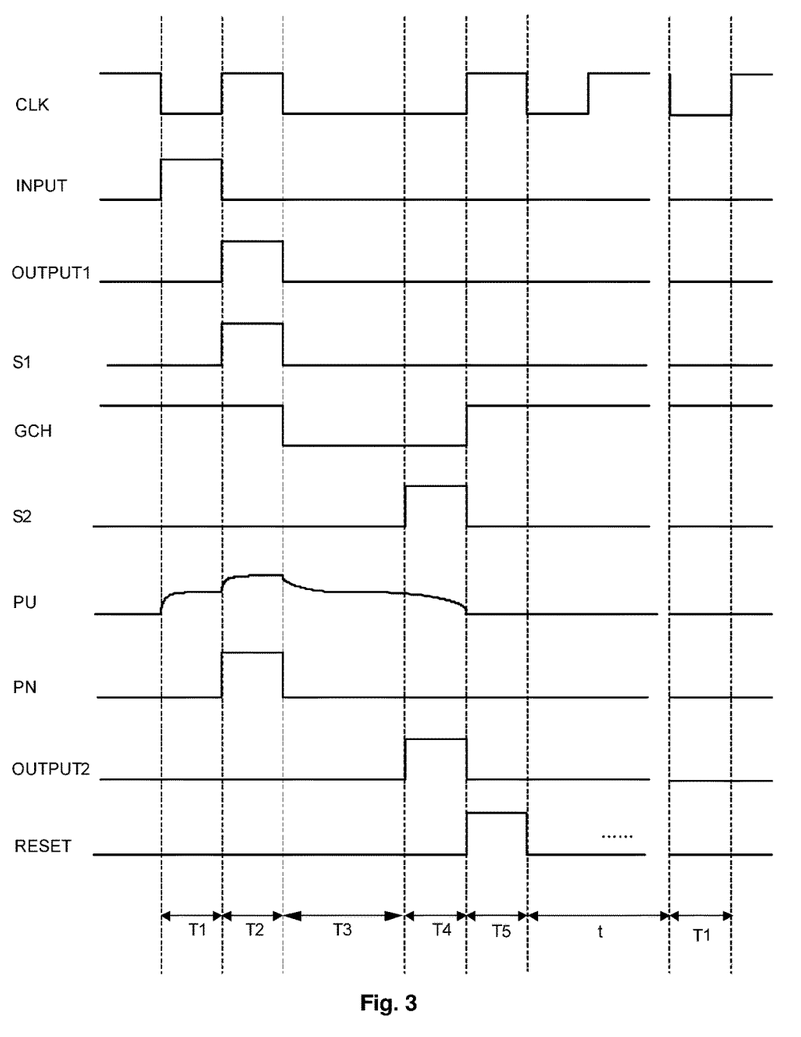
FIG. 3 is an operation timing diagram of a shift register according to an embodiment of the present disclosure.

All of the transistors M1-M11 in the shift register according to the embodiment of the present disclosure being N-type thin film transistors is taken as an example. FIG. 3 is a timing diagram of a shift register according to an embodiment of the present disclosure. As shown in FIGS. 2 and 3, the shift register according to the embodiment of the present disclosure includes 11 transistor units (M1-M11), 2 capacitors (C1 and C2), 6 signal input terminals (INPUT, RESET, CLK, GCH, S1, and S2), 2 signal output terminals (OUTPUT1 and OUTPUT2) and 3 power supply terminals (VDD, VGL and VSS).

Specifically, a high level signal is continuously provided by the first power supply terminal VDD; and low level signals are continuously provided by the second power supply terminal VGL and the third power supply terminal VSS.

It should be illustrated that start and end periods of an active level of the touch control signal terminal GCH depend on times of falling edges of the signals from the first touch signal terminal S1 and the second touch signal terminal S2. Specifically, if the falling edge of the signal from the first touch signal terminal S1 is detected, the signal from the touch control signal terminal GCH is at a low level until the falling edge of the signal from the second touch signal terminal S2 signal is detected, at which time the signal from the touch control signal terminal GCH is restored to a high level.

The clock signal provided by the clock signal terminal CLK is a signal which is obtained by performing an AND operation on the clock signal terminal CLK and the touch control signal terminal GCH.

It should be illustrated that if intra-frame touch does not need to be implemented in the current stage of shift register, both of the signals from the first touch signal terminal and the second touch signal terminal are low level signals.

Specifically,

In a first phase T1, i.e., an input phase, the signal from the signal input terminal INPUT is at a high level, and then the first transistor M1 is turned on to pull up the potential at the first node PU, so as to charge the first capacitor C1.

In this phase, the signals from the signal input terminal INPUT and the touch control signal terminal GCH among the input terminals are at a high level, the signals from the reset signal terminal RESET, the clock signal terminal CLK, the first touch signal terminal S1 and the second touch signal terminal S2 among the input terminals are at a low level, and output signals from the first output terminal OUTPUT1 and the second output terminal OUTPUT2 are at a low level. Although the signal from the touch control signal terminal GCH is at a high level, and then the ninth transistor M9 is turned on, and the potential at the first node PU is at a high level, and then the tenth transistor M10 is turned on to pull down the potential at the second electrode of the ninth transistor M9, the channel width to length ratios of the ninth transistor M9 and the tenth transistor M10 may be designed so that the eleventh transistor Mi i is not turned on in this phase.

In a second phase T2, i.e., an output phase, the signal from the signal input terminal INPUT is at a low level, and then the first transistor M1 is turned off; the signal from the clock signal terminal CLK becomes a high level, and then the potential at the first node PU continues to be pulled up due to a bootstrap effect of the first capacitor C1 and the third transistor M3 and the fifth transistor to be turned on due to a high level of the first node PU; and the signal from the clock signal terminal CLK is output from the first output terminal OUTPUT1, i.e., a gate driving signal for the current stage of shift register, and the potential at the second node PN is pulled up to a high level of the signal from the clock signal terminal CLK. In this case, the signal from the first touch signal terminal S1 becomes a high level, and then the seventh transistor M7 is turned on to store the potential at the second node PN in the second capacitor C2. In addition, as the potential at the first node PU increases, the turn-on capability of the third transistor M3 and the fifth transistor M5 is improved, and pixel charging is ensured.

In this phase, the signals from the clock signal terminal CLK, the touch control signal terminal GCH, and the first touch signal terminal S1 among the input terminals are at a high level, the signals from the signal input terminal INPUT, the reset signal terminal RESET, and the second touch signal terminal S2 among the input terminals are at a low level, the output signal from the first output terminal OUTPUT1 is at a high level, and the output signal from the second output terminal OUTPUT2 is at a low level.

In a third phase T3, i.e., a touch phase, all of the signal input terminal INPUT, the touch control signal terminal GCH, the clock signal terminal CLK, the reset signal terminal RESET, the first touch signal terminal S1, and the second touch signal terminal S2 among the input terminals are at a low level. In this case, due to capacitance functions of the first capacitor C1 and transistors themselves, the potential at the first node PU gradually decreases. Although the potential at the first node PU is still at a high level, as the signal from the clock signal terminal CLK is at a low level, the potentials at the first output terminal OUTPUT1 and the second node PN are pulled down to a low level, which reduces the noise.

In a fourth phase T4, i.e., a transition phase, the signal from the second touch signal terminal S2 is at a high level, then the eighth transistor M8 is turned on to release the potential stored in the second capacitor C2 to the second output terminal OUTPUT2, so as to provide a high level signal to a signal input terminal of a next stage of shift register.

In this phase, the signal from the second touch signal terminal S2 among the input terminals is at a high level, the signals from the clock signal terminal CLK, the touch control signal terminal GCH, the signal input terminal INPUT, the reset signal terminal RESET, and the first touch signal terminal S1 among the input terminals are at a low level, the output signal from the first output terminal OUTPUT1 is at a high level, and the output signal from the second output terminal OUTPUT2 is at a high level. Although the potential at the first node PU gradually decreases, it is still at a high level, but as the signal from the clock signal terminal CLK is at a low level, the potentials at the first output terminal OUTPUT1 and the second node PN are pulled down to a low level, which reduces the noise.

In a fifth phase T5, i.e., a reset phase, the signal from the reset signal terminal RESET is at a high level, then the second transistor M2 is turned on to pull down the potential at the first node PU to the low level of the third power supply terminal VSS, and the fourth transistor M4 is turned on to pull down the potential at the second node PN to the low level of the second power supply terminal VGL, the sixth transistor M6 is turned on to pull down the potential at the first output terminal OUTPUT1 to the low level of the second power supply terminal VGL, the nine transistor M9 is turned on, and as the first node PU is at a low level, the tenth transistor M10 is turned off and the eleventh transistor M11 is turned on to pull down the potential at the second node PN to the low level of the second power supply terminal VGL. The signal from the touch control signal terminal GCH is at a high level, and then the ninth transistor M9 is turned on, and as the potential at the first node PU is at a low level, the tenth transistor M10 is turned off. In this case, the eleventh transistor M11 is turned on to pull down the potential at the second node PN to the low level of the second power supply terminal VGL.

In this phase, the signals from the clock signal terminal CLK, the reset signal terminal RESET, and the touch control signal terminal GCH among the input terminals are at a high level, the signals from the signal input terminal INPUT, the first touch signal terminal S1, and the second touch signal terminal S2 among the input terminals are at a low level, and the output signals from the first output terminal OUTPUT1 and the second output terminal OUTPUT2 are at a low level. Although there is period in which the clock signal from the clock signal terminal CLK is at a high level, as the potential at the first node PU is at a low level, the third transistor M3 and the fifth transistor M5 are turned off. Therefore, the output signal from the first output terminal OUTPUT1 and the potential at the second node PN are not pulled up.

In the present embodiment, the reset signal terminal RESET is electrically connected to a second output terminal OUTPUT2 of the next stage of shift register.

In all phases, the signal from the first power supply terminal VDD is continuously at a high level, and the signals of the second power supply terminal VGL and the third power supply terminal VSS are continuously at a low level.

After the reset phase T5, the current stage of shift register is in a hold phase, until a high level signal is received by the current stage of shift register via the signal input terminal INPUT again.

In the present embodiment, the signal from the signal input terminal INPUT is a pulse signal, which is at a high level only in the input phase; the output signal from the first output terminal OUTPUT1 is a pulse signal, which is at a high level only in the output phase; the output signal from the second output terminal OUTPUT2 is a pulse signal, which is at a high level only in the transition phase; the signal from the reset signal terminal RESET is a pulse signal, which is at a high level only in the reset phase; the signal from the touch control signal terminal GCH is at a high level in the input phase, the output phase and the reset phase; the signal from the first touch signal terminal S1 is a pulse signal, which is at a high level only in the output phase; and the signal from the second touch signal terminal S2 is a pulse signal, which is at a high level only in the transition phase. The signal from the clock signal terminal CLK is continuously at a low level in the touch phase and the transition phase, and is a periodic signal in other phases. In addition, it should be understood that in the touch phase, the signals from the first touch signal terminal S1, the second touch signal terminal S2, the touch control signal terminal GCH, the signal input terminal INPUT, and the reset signal terminal RESET are all at a low level.

Specifically, the signal from the clock signal terminal CLK is continuously at a low level in the touch phase and the transition phase, which can be realized by performing an AND operation on the signal from the clock signal terminal CLK and the signal from the touch control signal terminal GCH. In addition, the signal from the clock signal terminal CLK is continuously at a low level in the touch phase and the transition phase, which can prevent cross talk with a touch signal and improve the touch performance.

In addition, it should be illustrated that if inter-frame touch still needs to be realized in the next stage of shift register, the reset phase of the current stage of shift register begins to be implemented only after a transition phase of the next stage of shift register.

Figure 4:
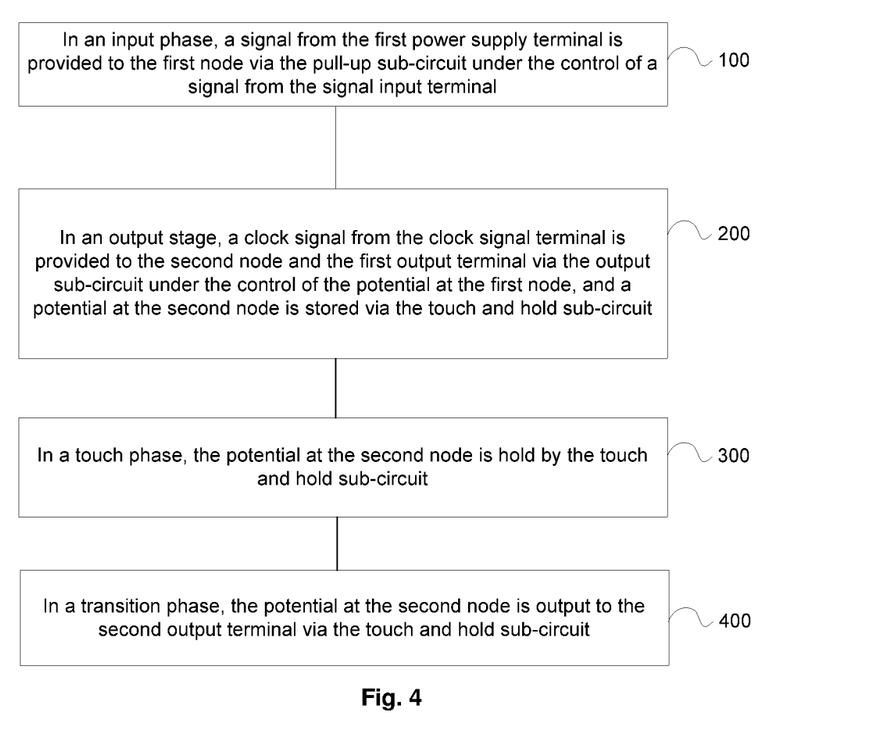
FIG. 4 is a flowchart of a driving method of a shift register according to an embodiment of the present disclosure.

Based on the concept of the embodiments described above, the embodiments of the present disclosure further provide a driving method of the shift register according to the embodiments described above. FIG. 4 is a flowchart of a driving method of a shift register according to an embodiment of the present disclosure. The shift register includes a signal input terminal INPUT, a reset signal terminal RESET, a clock signal terminal CLK, a touch control signal terminal GCH, a first touch signal terminal S1, a second touch signal terminal S2, a first output terminal OUTPUT1, a second output terminal OUTPUT2, a pull-up sub-circuit, an output sub-circuit, a reset sub-circuit, a de-noising sub-circuit and a touch and hold sub-circuit. As shown in FIG. 4, the driving method of the shift register according to the present embodiment specifically includes the following steps.

In step 100, in an input phase, a signal from the first power supply terminal is provided by the pull-up sub-circuit to the first node under control of a signal from the signal input terminal.

Specifically, the signal from the signal input terminal is a pulse signal. In step 100, the signal from the signal input terminal is at a high level, and the potential at the first node is pulled up by the pull-up sub-circuit.

In step 200, in an output stage, a clock signal from the clock signal terminal is provided by the output sub-circuit to the second node and the first output terminal under control of the potential at the first node, and a potential at the second node is stored by the touch and hold sub-circuit.

Specifically, under the action of bootstrap of a capacitor, the potential at the first node further increases, the clock signal is at a high level, and the output signal from the first output terminal is at a high level.

In an embodiment, the touch and hold sub-circuit may store the potential at the second node by storing, by the touch and hold sub-circuit, the potential at the second node under control of the signal from the first touch signal terminal.

In step 300, in a touch phase, the potential at the second node is held by the touch and hold sub-circuit.

In step 400, in a transition phase, the potential at the second node is output by the touch and hold sub-circuit to the second output terminal.

Specifically, step 400 may be implemented by outputting, by the touch and hold sub-circuit, the potential at the second node to the second output terminal under control of the signal from the second touch signal terminal.

In the technical solutions according to the present disclosure, the touch and hold sub-circuit is added in the shift register, and therefore a touch timing can be inserted after a gate output for any row is completed. By storing an output signal of a row for which scanning is interrupted, and the output signal may be output after the touch timing has passed to continue to trigger a next row, so as to complete progressive output of the gate driving signal. In this way, not only intra-frame touch is realized, but also the touch frequency and touch performance can be improved.

In an embodiment, the method further includes: in the reset phase, providing, by the reset sub-circuit, a signal from the third power supply terminal to the first node and providing a signal from the second power supply terminal to the second node and the first output terminal under control of the signal from the reset signal terminal, and providing, by the de-noising sub-circuit, the signal from the second power supply terminal to the second node under control of the signal from the touch control signal terminal and the potential at the first node.

Specifically, the signal from the reset signal terminal is a pulse signal, the signal from the reset signal terminal is at a high level, and the potentials at the first node, the second node, and the first output terminal are pulled down by the reset sub-circuit to avoid the noise.

Specifically, all of the transistors M1-M11 in the shift register according to the embodiment of the present disclosure being N-type thin film transistors is taken as an example. The signal from the first power supply terminal is at a high level, and the signals from the second power supply terminal and the third power supply terminal are at a low level. In the input phase, the signals from the signal input terminal and the touch control signal terminal are at a high level; in the output phase, the signals from the touch control signal terminal and the first touch signal terminal are at a high level; in the transition phase, the signal from the second touch signal terminal is at a high level; and in the reset phase, the signals from the reset signal terminal and the touch control signal terminal are at a high level. In addition, in the touch phase and the transition phase, the clock signal is at a low level.

Figure 5:
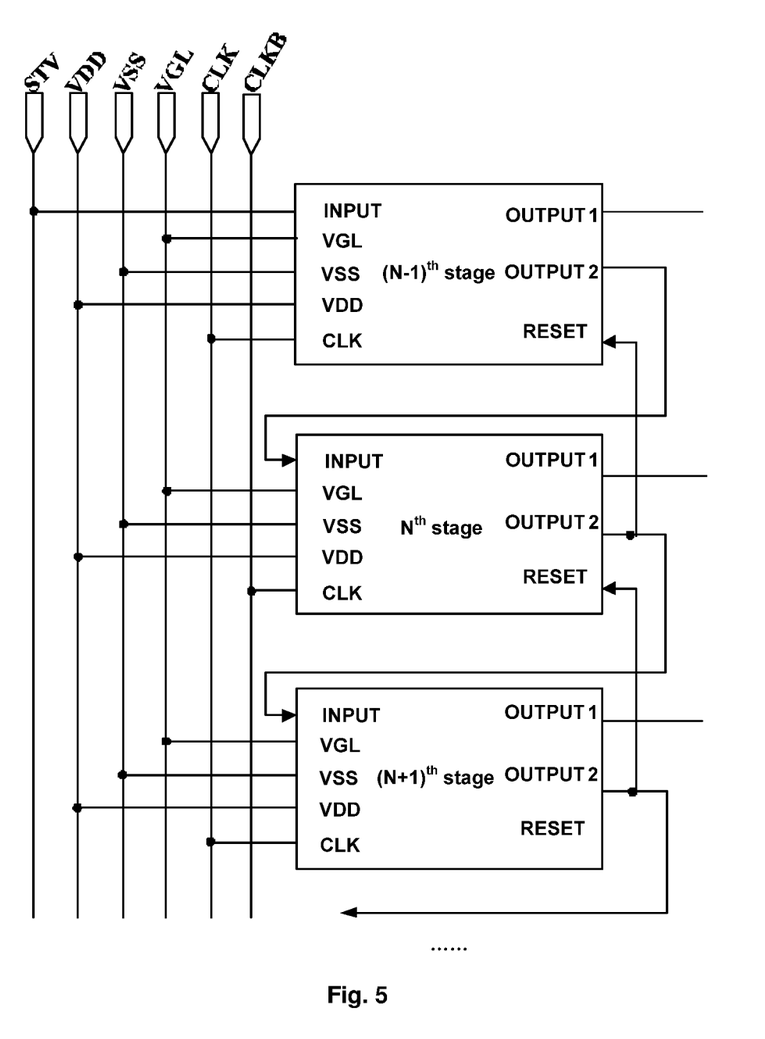
FIG. 5 is a structural diagram of a gate driving circuit according to an embodiment of the present disclosure.

Based on the concept of the embodiments described above, the embodiments of the present disclosure further provide a gate driving circuit. FIG. 5 is a structural diagram of a gate driving circuit according to an embodiment of the present disclosure. As shown in FIG. 5, the gate driving circuit according to the embodiment of the present disclosure includes a plurality of cascaded shift registers.

Specifically, for each stage of shift register except for a last stage of shift register, a second output terminal of a current stage of shift register is electrically connected to a signal input terminal of a next stage of shift register, and a reset signal terminal of the current stage of shift register is electrically connected to a second output terminal of the next stage of shift register. For example, a second output terminal of an $N^{th}$ stage of shift register is electrically connected to a signal input terminal of an $(N+1)^{th}$ stage of shift register, and a reset signal terminal of the $N^{th}$ stage of shift register is electrically connected to a second output terminal of the $(N+1)^{th}$ stage of shift register.

As shown in FIG. 5, a signal input terminal of an $(N-1)^{th}$ stage of shift register is electrically connected to an initial signal terminal STV, a second output terminal of the $(N-1)^{th}$ stage of shift register is electrically connected to a signal input terminal of the $N^{th}$ stage of shift register, and a reset signal terminal RESET of the $(N-1)^{th}$ stage of shift register is electrically connected to a second output terminal OUTPUT2 of the $N^{th}$ stage of shift register.

Each stage of shift register is the shift register according to the embodiments described above, and has similar implementation principle and implementation effect to those above, which will not be repeated here.

Based on the concept of the embodiments described above, the embodiments of the present disclosure further provide a display apparatus including a gate driving circuit.

The gate driving circuit is the gate driving circuit according to the embodiments described above, and has similar implementation principle and implementation effect to those above, which will not be repeated here.

The accompanying drawings in the embodiments of the present disclosure only relate to the structures involved in the embodiments of the present disclosure, and other structures can be known with reference to the common designs.

The embodiments of the present disclosure, that is, the features in the embodiments, can be combined with each other without a conflict to obtain new embodiments.

Although the embodiments of the present disclosure are described as above, the contents described are merely implementations used for facilitating the understanding of the present disclosure and are not intended to limit the present disclosure. Any person skilled in the art to which the present disclosure pertains can make any modifications and changes to the implementations in forms and details without departing from the spirit and the scope disclosed in the present disclosure, but the patent protection scope of the present disclosure is still based on the scope defined by the attached claims.

We claim:

1. A shift register, comprising:
a pull-up sub-circuit;
an output sub-circuit; and
a touch and hold sub-circuit, wherein:
the pull-up sub-circuit is electrically connected to a first power supply terminal, a signal input terminal and a first node, and is configured to provide a signal from the first power supply terminal to the first node under control of a signal from the signal input terminal;
the output sub-circuit is electrically connected to a clock signal terminal, the first node, a second node and a first output terminal, and is configured to provide a clock signal from the clock signal terminal to the second node and the first output terminal under control of a potential at the first node; and
the touch and hold sub-circuit is electrically connected to a first touch signal terminal, a second touch signal terminal, the second node, a second power supply terminal, and a second output terminal, and is configured to store a potential at the second node and output the potential at the second node to the second output terminal under control of signals from the first touch signal terminal and the second touch signal terminal.

2. The shift register according to claim 1, further comprising:
a de-noising sub-circuit; and
a reset sub-circuit, wherein:
the de-noising sub-circuit is electrically connected to the first node, the second node, the second power supply terminal, and a touch control signal terminal, and is configured to provide a signal from the second power supply terminal to the second node under control of a signal from the touch control signal terminal and the potential at the first node; and
the reset sub-circuit is electrically connected to a reset signal terminal, the second power supply terminal, a third power supply terminal, the first node, the second node, and the first output terminal, and is configured to provide a signal from the third power supply terminal to the first node and provide the signal from the second power supply terminal to the second node and the first output terminal under control of a signal from the reset signal terminal.

3. The shift register according to claim 2, wherein the reset sub-circuit comprises a second transistor, a fourth transistor and a sixth transistor, and wherein:
the second transistor has a gate electrically connected to the reset signal terminal, a first electrode electrically connected to the first node, and a second electrode electrically connected to the third power supply terminal;

the fourth transistor has a gate electrically connected to the reset signal terminal, a first electrode electrically connected to the second node, and a second electrode electrically connected to the second power supply terminal; and the sixth transistor has a gate electrically connected to the reset signal terminal, a first electrode electrically connected to the first output terminal, and a second electrode electrically connected to the second power supply terminal.

4. The shift register according to claim 2, wherein the de-noising sub-circuit comprises a ninth transistor, a tenth transistor, and an eleventh transistor, and wherein:

the ninth transistor has a gate and a first electrode electrically connected to the touch control signal terminal, and a second electrode electrically connected to a gate of the eleventh transistor;

the tenth transistor has a gate electrically connected to the first node, a first electrode electrically connected to the gate of the eleventh transistor, and a second electrode electrically connected to the second power supply terminal; and the eleventh transistor has a first electrode electrically connected to the second node, and a second electrode electrically connected to the second power supply terminal.

5. The shift register according to claim 2, wherein the touch and hold sub-circuit comprises a seventh transistor, an eighth transistor and a second capacitor, and wherein:

the seventh transistor has a gate electrically connected to the first touch signal terminal, a first electrode electrically connected to the second node, and a second electrode electrically connected to a first electrode of the eighth transistor;

the eighth transistor has a gate electrically connected to the second touch signal terminal, the first electrode electrically connected to one terminal of the second capacitor, and a second electrode electrically connected to the second output terminal; and the second capacitor has the other terminal electrically connected to the second power supply terminal.

6. The shift register according to claim 1, wherein the pull-up sub-circuit comprises a first transistor, and wherein the first transistor has a gate electrically connected to the signal input terminal, a first electrode electrically connected to the first power supply terminal, and a second electrode electrically connected to the first node.

7. The shift register according to claim 1, wherein the output sub-circuit comprises a first capacitor, a third transistor and a fifth transistor, and wherein:

the first capacitor has one terminal electrically connected to the first node, and the other terminal electrically connected to the second node;

the third transistor has a gate electrically connected to the first node, a first electrode electrically connected to the clock signal terminal, and a second electrode electrically connected to the second node; and the fifth transistor has a gate electrically connected to the first node, a first electrode electrically connected to the clock signal terminal, and a second electrode electrically connected to the first output terminal.

8. The shift register according to claim 1, wherein the touch and hold sub-circuit comprises a seventh transistor, an eighth transistor and a second capacitor, and wherein:

the seventh transistor has a gate electrically connected to the first touch signal terminal, a first electrode electrically connected to the second node, and a second electrode electrically connected to a first electrode of the eighth transistor;

the eighth transistor has a gate electrically connected to the second touch signal terminal, the first electrode electrically connected to one terminal of the second capacitor, and a second electrode electrically connected to the second output terminal; and the second capacitor has the other terminal electrically connected to the second power supply terminal.

9. A gate driving circuit, comprising a plurality of cascaded shift registers according to claim 8, wherein for each stage of the plurality of cascaded shift registers except for a last stage of the plurality of cascaded shift registers, a second output terminal of a current stage of the plurality of cascaded shift registers is electrically connected to a signal input terminal of a next stage of the plurality of cascaded shift registers, and a reset signal terminal of the current stage of the plurality of cascaded shift registers is electrically connected to a second output terminal of the next stage of the plurality of cascaded shift registers.

10. A display apparatus, comprising the gate driving circuit according to claim 9.

11. A driving method of the shift register according to claim 8, comprising:

providing, by the pull-up sub-circuit in an input phase, a signal from the first power supply terminal to the first node under control of a signal from the signal input terminal;

providing, by the output sub-circuit in an output phase, a clock signal from the clock signal terminal to the second node and the first output terminal under control of a potential at the first node, and storing, by the touch and hold sub-circuit, a potential at the second node ;

holding, by the touch and hold sub-circuit in a touch phase, the potential at the second node; and outputting, by the touch and hold sub-circuit in a transition phase, the potential at the second node to the second output terminal.

12. The method according to claim 11, further comprising:

providing, by the reset sub-circuit in a reset phase, a signal from the third power supply terminal to the first node and providing a signal from the second power supply terminal to the second node and the first output terminal under control of a signal from the reset signal terminal, and providing, by the de-noising sub-circuit, the signal from the second power supply terminal to the second node under control of a signal from the touch control signal terminal and the potential at the first node.

13. The method according to claim 11, wherein storing, by the touch and hold sub-circuit, the potential at the second node comprises:

storing, by the touch and hold sub-circuit, the potential at the second node under control of a signal from the first touch signal terminal.

14. The method according to claim 11, wherein outputting, by the touch and hold sub-circuit, the potential at the second node to the second output terminal comprises:

outputting, by the touch and hold sub-circuit, the potential at the second node to the second output terminal under control of a signal from the second touch signal terminal.

15. A gate driving circuit, comprising a plurality of cascaded shift registers according to claim 1, wherein:

for each stage of the plurality of cascaded shift registers except for a last stage of the plurality of cascaded shift registers, a second output terminal of a current stage of the plurality of cascaded shift registers is electrically connected to a signal input terminal of a next stage of the plurality of cascaded shift registers, and a reset signal terminal of the current stage of the plurality of cascaded shift registers is electrically connected to a second output terminal of the next stage of the plurality of cascaded shift registers.

16. A display apparatus, comprising the gate driving circuit according to claim 15.

17. A driving method of the shift register according to claim 1, comprising:

providing, by the pull-up sub-circuit in an input phase, a signal from the first power supply terminal to the first node under control of a signal from the signal input terminal;

providing, by the output sub-circuit in an output phase, a clock signal from the clock signal terminal to the second node and the first output terminal under control of a potential at the first node, and storing, by the touch and hold sub-circuit, a potential at the second node;

holding, by the touch and hold sub-circuit in a touch phase, the potential at the second node; and outputting, by the touch and hold sub-circuit in a transition phase, the potential at the second node to the second output terminal.

18. The method according to claim 17, further comprising:

providing, by the reset sub-circuit in a reset phase, a signal from the third power supply terminal to the first node and providing a signal from the second power supply terminal to the second node and the first output terminal under control of a signal from the reset signal terminal, and providing, by the de-noising sub-circuit, the signal from the second power supply terminal to the second node under control of a signal from the touch control signal terminal and the potential at the first node.

19. The method according to claim 17, wherein storing, by the touch and hold sub-circuit, the potential at the second node comprises:

storing, by the touch and hold sub-circuit, the potential at the second node under control of a signal from the first touch signal terminal.

20. The method according to claim 17, wherein outputting, by the touch and hold sub-circuit, the potential at the second node to the second output terminal comprises:

outputting, by the touch and hold sub-circuit, the potential at the second node to the second output terminal under control of a signal from the second touch signal terminal.

* * * * *